(12) United States Patent
Chang et al.

(10) Patent No.: US 9,941,244 B2
(45) Date of Patent: Apr. 10, 2018

(54) PROTECTIVE LAYER FOR CONTACT PADS IN FAN-OUT INTERCONNECT STRUCTURE AND METHOD OF FORMING SAME

(71) Applicant: Taiwan Semiconductor Manufacturing Company, Ltd., Hsin-Chu (TW)

(72) Inventors: Chin-Chuan Chang, Zhudong Township (TW); Tsei-Chung Fu, Toufen Township (TW); Jing-Cheng Lin, Chu Tung Zhen (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 83 days.

(21) Appl. No.: 14/100,987

(22) Filed: Dec. 9, 2013

(65) Prior Publication Data

US 2015/0162289 A1   Jun. 11, 2015

(51) Int. Cl.
*H01L 23/00* (2006.01)
*H01L 23/31* (2006.01)
*H01L 23/522* (2006.01)
*H01L 21/56* (2006.01)

(52) U.S. Cl.
CPC .......... *H01L 24/96* (2013.01); *H01L 23/3185* (2013.01); *H01L 23/5226* (2013.01); *H01L 24/19* (2013.01); *H01L 21/561* (2013.01); *H01L 21/568* (2013.01); *H01L 24/13* (2013.01); *H01L 24/16* (2013.01); *H01L 2224/0239* (2013.01); *H01L 2224/02381* (2013.01); *H01L 2224/0401* (2013.01); *H01L 2224/04105* (2013.01); *H01L 2224/05018* (2013.01); *H01L 2224/05124* (2013.01); *H01L 2224/05144* (2013.01); *H01L 2224/05147* (2013.01); *H01L 2224/05569* (2013.01); *H01L 2224/05572* (2013.01); *H01L 2224/05647* (2013.01); *H01L 2224/05666* (2013.01); *H01L 2224/12105* (2013.01); *H01L 2224/13111* (2013.01); *H01L 2224/13147* (2013.01); *H01L 2224/16145* (2013.01); *H01L 2224/16225* (2013.01); *H01L 2224/94* (2013.01); *H01L 2924/12042* (2013.01);
(Continued)

(58) Field of Classification Search
CPC ............. H01L 23/5226; H01L 23/3185; H01L 23/3107; H01L 23/3135; H01L 23/3121; H01L 23/3192
See application file for complete search history.

(56) References Cited

U.S. PATENT DOCUMENTS 6,165,912 A * 12/2000 McConnell et al. .......... 438/758
6,770,971 B2 * 8/2004 Kouno ................. H01L 23/3114
                                                  252/514
(Continued)

*Primary Examiner* — Phat X Cao
*Assistant Examiner* — Diana C Vieira
(74) *Attorney, Agent, or Firm* — Slater Matsil, LLP

(57) ABSTRACT

In accordance with a method embodiment includes providing a die having a contact pad on a top surface and forming a conductive protective layer over the die and covering the contact pad. A molding compound is formed over the die and the conductive protective layer. The conductive protective layer is exposed using a laser drilling process. A redistribution layer (RDL) is formed over the die. The RDL is electrically connected to the contact pad through the conductive protective layer.

24 Claims, 18 Drawing Sheets

FIG. 1C

(52) U.S. Cl.
CPC .... *H01L 2924/14* (2013.01); *H01L 2924/181* (2013.01); *H01L 2924/18162* (2013.01)

(56) References Cited

U.S. PATENT DOCUMENTS

| | | | | |
|---|---|---|---|---|
| 7,075,181 B2* | 7/2006 | Wakabayashi | ...... | H01L 23/5389 257/690 |
| 7,489,032 B2* | 2/2009 | Jobetto | ...... | H01L 23/16 257/700 |
| 7,776,655 B2* | 8/2010 | Do et al. | ...... | 438/113 |
| 7,993,972 B2* | 8/2011 | Lin et al. | ...... | 438/109 |
| 8,624,353 B2* | 1/2014 | Lin | ...... | H01L 21/561 257/531 |
| 8,765,531 B2* | 7/2014 | Gatterbauer | ...... | H01L 24/05 257/734 |
| 2013/0175696 A1* | 7/2013 | Lin | ...... | H01L 21/568 257/773 |
| 2013/0200528 A1* | 8/2013 | Lin | ...... | H01L 24/97 257/774 |
| 2014/0124914 A1* | 5/2014 | Lin | ...... | H01L 23/36 257/712 |

\* cited by examiner

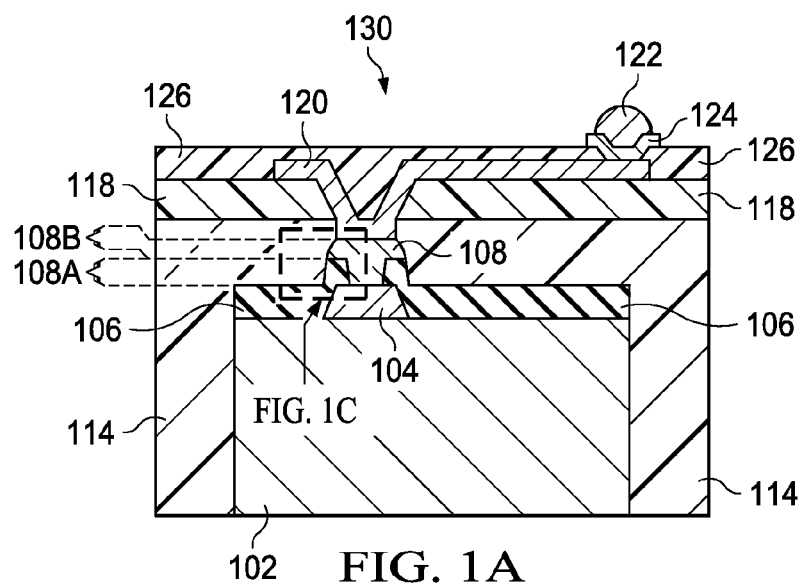
FIG. 1A
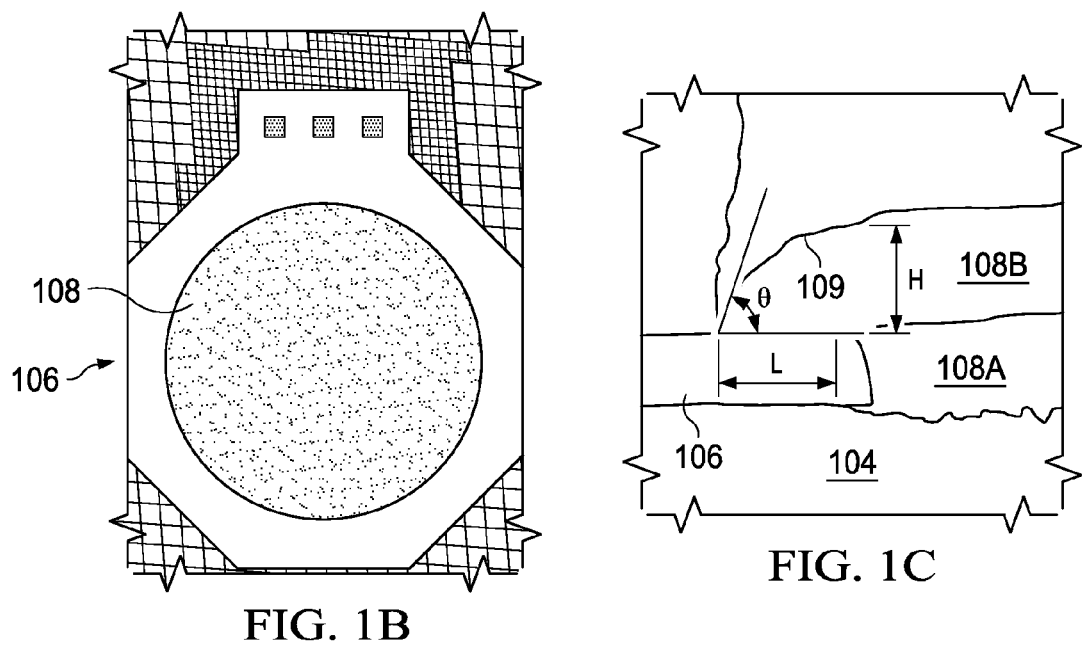
FIG. 1B
FIG. 1C

PROTECTIVE LAYER FOR CONTACT PADS IN FAN-OUT INTERCONNECT STRUCTURE AND METHOD OF FORMING SAME

BACKGROUND

A typical integrated circuit structure is made up of dies that include active devices such as transistors and capacitors. These devices are initially isolated from each other, and interconnect structures are later formed over the active devices to create functional circuits. On top of the interconnect structures, contact pads are formed and exposed on the surface of the respective die. Electrical connections are made through the metal pads to connect the die to a package substrate or another die.

In an aspect of conventional packaging technologies, such as fan-out packaging, redistribution layers (RDLs) may be formed over a die and electrically connected to the contact pads. Input/output (I/O) pads, such as solder balls, may then be formed to electrically connect to the contact pads through the RDLs. An advantageous feature of this packaging technology is the possibility of forming fan-out packages, which means the I/O pads on a die can be redistributed to a greater area than the die, and hence the number of I/O pads packed on the surfaces of the dies can be increased.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 1A through 1C are cross sectional and top down views of a portions of a fan-out package in accordance with various embodiments;

DETAILED DESCRIPTION OF ILLUSTRATIVE EMBODIMENTS

Figure 2A:
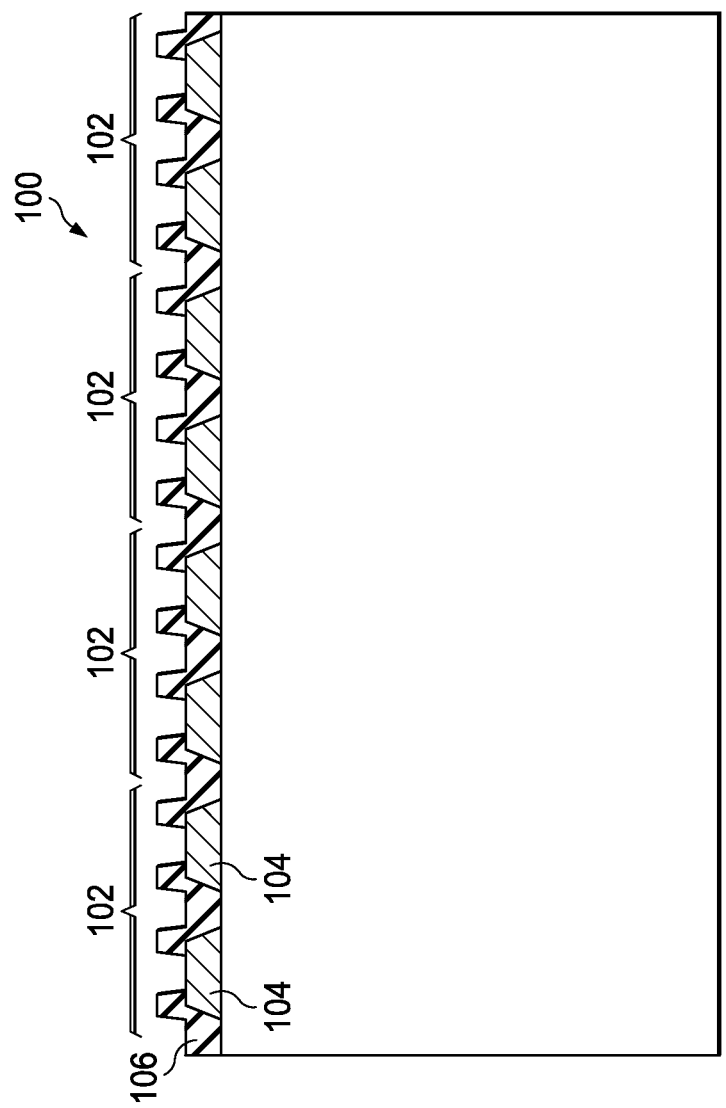
FIGS. 2A through 2J are cross-sectional views of various intermediary stages of manufacture of a fan-out package in accordance with various embodiments.

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Various embodiments will be described with respect to a specific context, namely a fan-out packaging technology such as fan-out wafer level packaging (FO-WLP). Various other embodiments, however, may be applied to other packaging technologies.

FIG. 1A is a cross-sectional view of a portion of an integrated circuit (IC) structure 130 in accordance with various embodiments. IC structure 130 includes a die 102 and a redistribution layer (RDL) 120 (sometimes referred to as a post-passivation interconnect (PPI)) over die 102. RDL 120 extends through polymer layers 126 and 118 to electrically connect to die 102. Lateral portions of RDL 120 may extend beyond edges of die 102 and over a molding compound 114. A conductive bump 122 in a under bump metallurgy (UBM) 124 is electrically connected to RDL 120 and may serve as an input/output pad. Therefore, the resulting IC structure 130 may be referred to as a fan-out package. Die 102 includes one or more contact pads 104, which electrically connect RDL 120 to various devices (not shown) in die 102. A passivation layer 106 may be formed over die 102, and passivation layer 106 may cover edges of contact pads 104.

RDL 120 may be electrically connected to contact pad 104 through a metallic protective layer 108, which may be in physical contact with contact pad 104. Protective layer 108 may be formed using one or more electroless plating processes of a metallic compound having a relatively high-melting point, for example, greater than about 800° Celsius. Protective layer 108 may have a portion 108A in passivation layer 106 and a portion 108B over passivation layer 106. Portion 108B may be wider than portion 108A. That is, protective layer 108 may extend over and cover edges of passivation layer 106. FIG. 1B illustrates a top-down view of protective layer 108. As illustrated in FIG. 1B, a top surface of contact pad 104 may be covered by protective layer 108. Furthermore, portion 108A may or may not be formed in the same electroless plating process and may or may not comprise the same materials as portion 108B. For example, portion 108A may be formed in a first electroless plating process using a metal having good adhesive qualities (e.g., nickel) while portion 108B may be formed in a second electroless plating process using a different metal (e.g., copper).

FIG. 1C illustrates a detailed cross-sectional view of protective layer 108 in IC structure 130. Because protective layer 108 may be formed using electroless plating processes, the profile of protective layer 108 may be irregular. For example, as indicated by solid line 109, a top surface of protective layer 108 (e.g., portion 108B) may be uneven and may not be substantially planar. Sidewalls of protective layer 108 (e.g., portion 108B over passivation layer 106) may also be irregular and may or may not be substantially perpendicular. In various embodiments an angle θ (defined by a line tangent to a sidewall of protective layer 108 and a top surface of passivation layer 106) may be between about 45° and about 90°. Furthermore, vertical and lateral deposition (e.g., growth due to electroless plating) of protective layer 108 may be at a substantially equal rate. Thus, for a portion of protective layer 108 extending over passivation layer 106, a vertical dimension H may be substantially equal to a horizontal dimension L. Protective layer 108 shields contact pad 104 from damage during laser drilling. Thus, the inclusion of protective layer 108 allows laser drilling to be used during the formation of IC structure 130 without damaging contact pad 104 while still allowing for electrical connections to contact pad 104.

FIGS. 2A-2J are cross-sectional views of intermediate stages of manufacture of the IC structure 130 of FIG. 1A through 1C in accordance with various embodiments. FIG. 2A illustrates a cross-sectional view of a wafer 100 having a plurality of dies 102. Dies 102 may include a substrate, active devices, and an interconnect structure (not shown). The substrate may be a bulk silicon substrate although other semiconductor materials including group III, group IV, and group V elements may also be used. Alternatively, the substrate may be a silicon-on-insulator (SOI) substrate. Active devices such as transistors may be formed on the top surface of the substrate. An interconnect structure may be formed over the active devices and the substrate.

The interconnect structure may include an inter-layer dielectric (ILD)/inter-metal dielectric layers (IMDs) formed over the substrate. The ILD and IMDs may be formed of low-k dielectric materials having k values, for example, lower than about 4.0. In some embodiments, the ILD and IMDs comprise silicon oxide, SiCOH, and the like.

Contact pads 104 are formed over the interconnect structure and may be electrically coupled to the active devices through various metallic lines and vias in the interconnect structure. Contact pads 104 may be made of a metallic material such as aluminum, although other metallic materials may also be used. A passivation layer 106 may be formed over dies 102 of non-organic materials such as silicon oxide, un-doped silicate glass, silicon oxynitride, and the like. Passivation layer 106 may extend over and cover edge portions of contact pads 104. Openings may be formed in portions of the passivation layer that cover contact pads 104, exposing at least a portion of contact pads 104. The various features of die 102 may be formed by any suitable method and are not described in further detail herein.

Figure 2B:
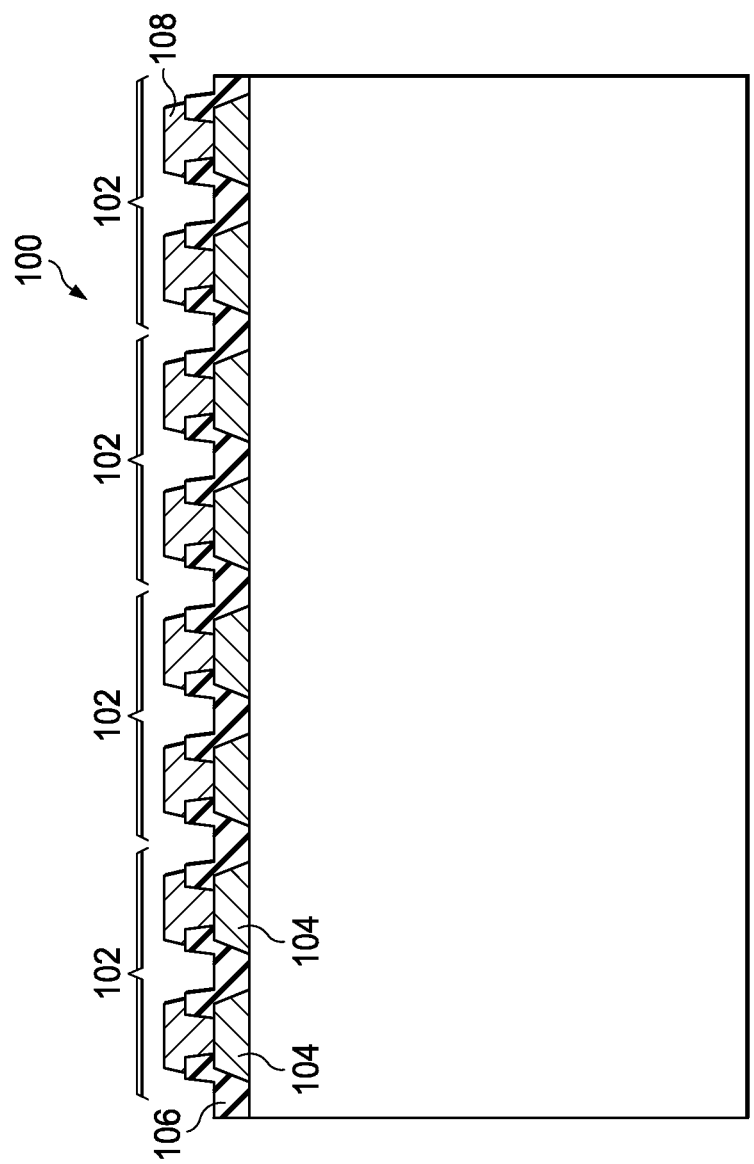

FIG. 2B illustrates the formation of a metallic protective layer 108 over contact pads 104. Protective layer 108 may be formed by electroless plating contact pads 104 with a metallic material. For example, a pre-treatment may be applied to contact pads 104 to clean the surface of contact pads 104 and to improve surface properties for plating (e.g., to roughen the surface texture of contact pads 104). This pre-treatment process generally includes the use of one or more chemical washes (e.g., acid washes) and/or wet etching processes on contact pads 104. A seed layer (not shown) may then be formed over dies 102. Subsequently, dies 102, including contact pads 104, may be submerged in an electroless bath comprising a metallic material at an appropriate temperature (e.g., between about 60 to 80 degrees Celsius), which results in the metallization of contact pads 104. As a result, contact pads 104 are plated with the metallic material. Subsequently, a wafer cleaning process may be applied to remove any residual materials.

The metallic material (sometimes referred to as a metal paste) used for metallization may be any suitable material having a relatively high melting point, for example, greater than about 800° Celsius. For example, the metal may be nickel (Ni), copper (Cu), silver (Ag), gold (Au), palladium (Pd), platinum (Pt), tin (Sn), zinc (Zn), Ruthenium (Ru), a noble metal, or a combination of these. In an embodiment, protective layer 108 is a nickel (Ni) layer. In some embodiments, the protective layer 108 is a nickel alloy layer, for example nickel-palladium-gold (NiPdAu), nickel-gold (NiAu), nickel-palladium (NiPd), or the like.

In some embodiments, more than one electroless plating processes may be applied to form protective layers 108. In such embodiments, different portions of protective layers 108 may comprise different metals. For example, the formation of protective layer 108 may include a first electroless plating process using a metal having improved adhesion properties (e.g., nickel) on contact pads 104. Subsequently, a second electroless plating process may be applied using a metal having improved protective properties (e.g., copper).

Protective layer 108 may extend over and cover portions of passivation layer 106. That is, protective layer may have a first portion (e.g., 108A in FIG. 1A) contacting contact pads 104 and a second portion (e.g., 108B in FIG. 1A) over the first portion where the second portion is wider than the first portion. In some embodiments, protective layer 108 is between about 2 μm to about 5 μm thick. Protective layer 108 may have a width of about 65 μm. Protective layer 108 prevents contact pads 104 from suffering damage during laser drilling in subsequent manufacture steps. As discussed in greater detail below, electrical contact to contact pads 104 will be made using conductive protective layer 108. Protective layer 108 provides protection to the underlying layer during subsequent processes, such as laser drilling, thereby reducing or preventing damage to contact pads 104.

Figure 2C:
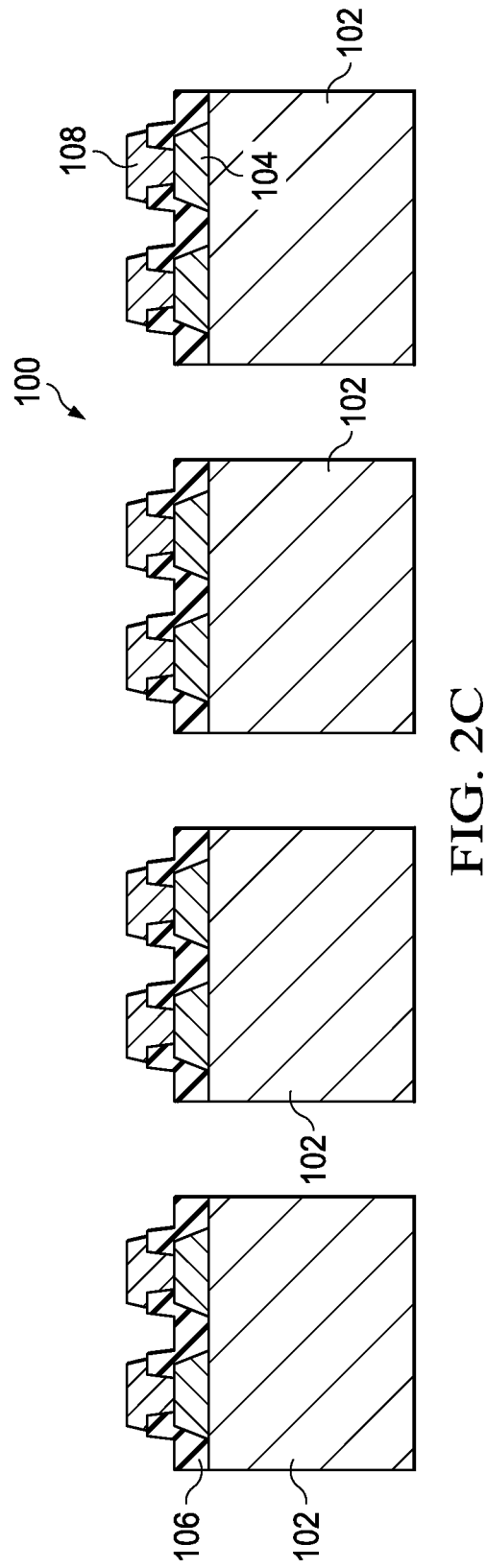
Figure 2D:
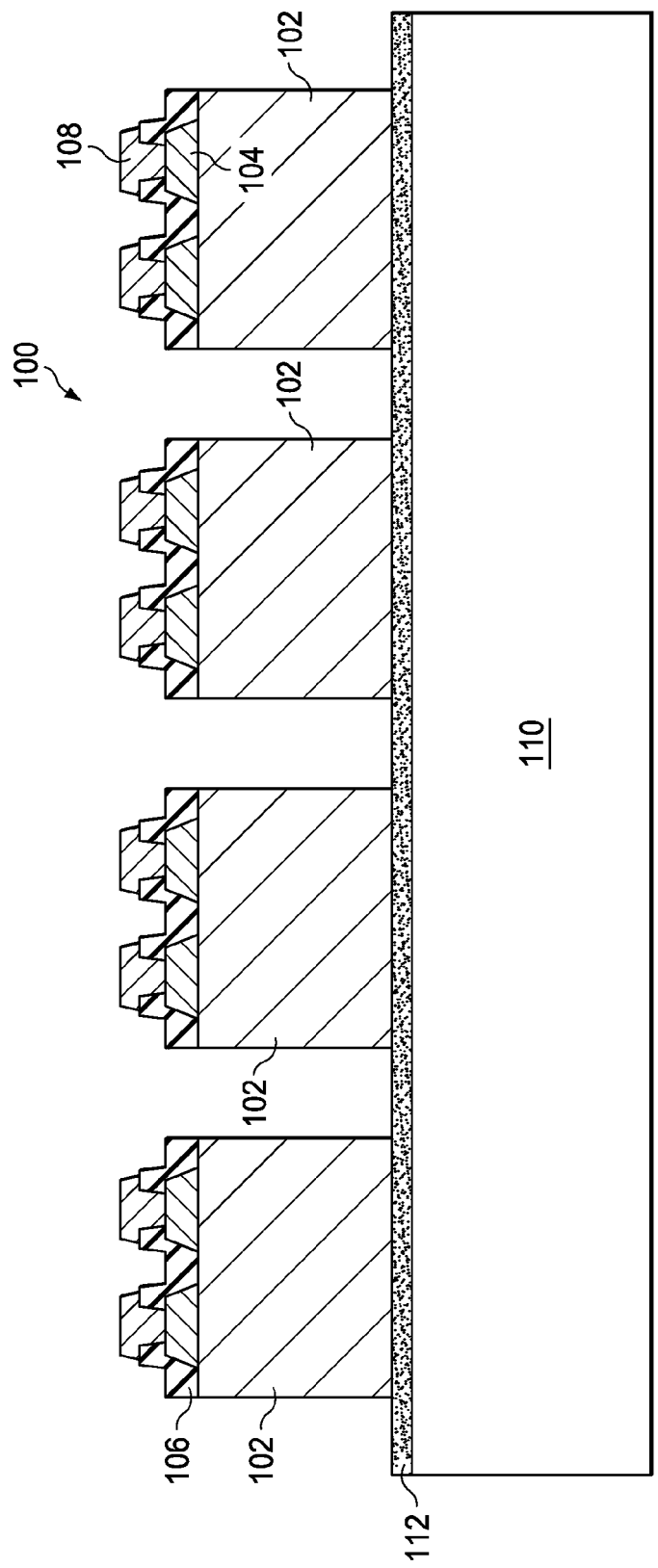

In FIG. 2C, dies 102 may be singulated from wafer 100. FIG. 2D illustrates the placement of dies 102 on a carrier 110 after singulation (e.g., through the use of an applicable pick-and-place tool). Carrier 110 may be made of a suitable material, for example, glass or a carrier tape. Dies 102 may be affixed to carrier 110 through one or more adhesive layers 112. Adhesive layers 112 may be formed of any temporary adhesive material such as ultraviolet (UV) tape, wax, glue, or the like. Adhesive layers 112 may further include a die attach film (DAF), which may have optionally been formed under dies 102 prior to their placement on carrier 110.

Figure 2E:
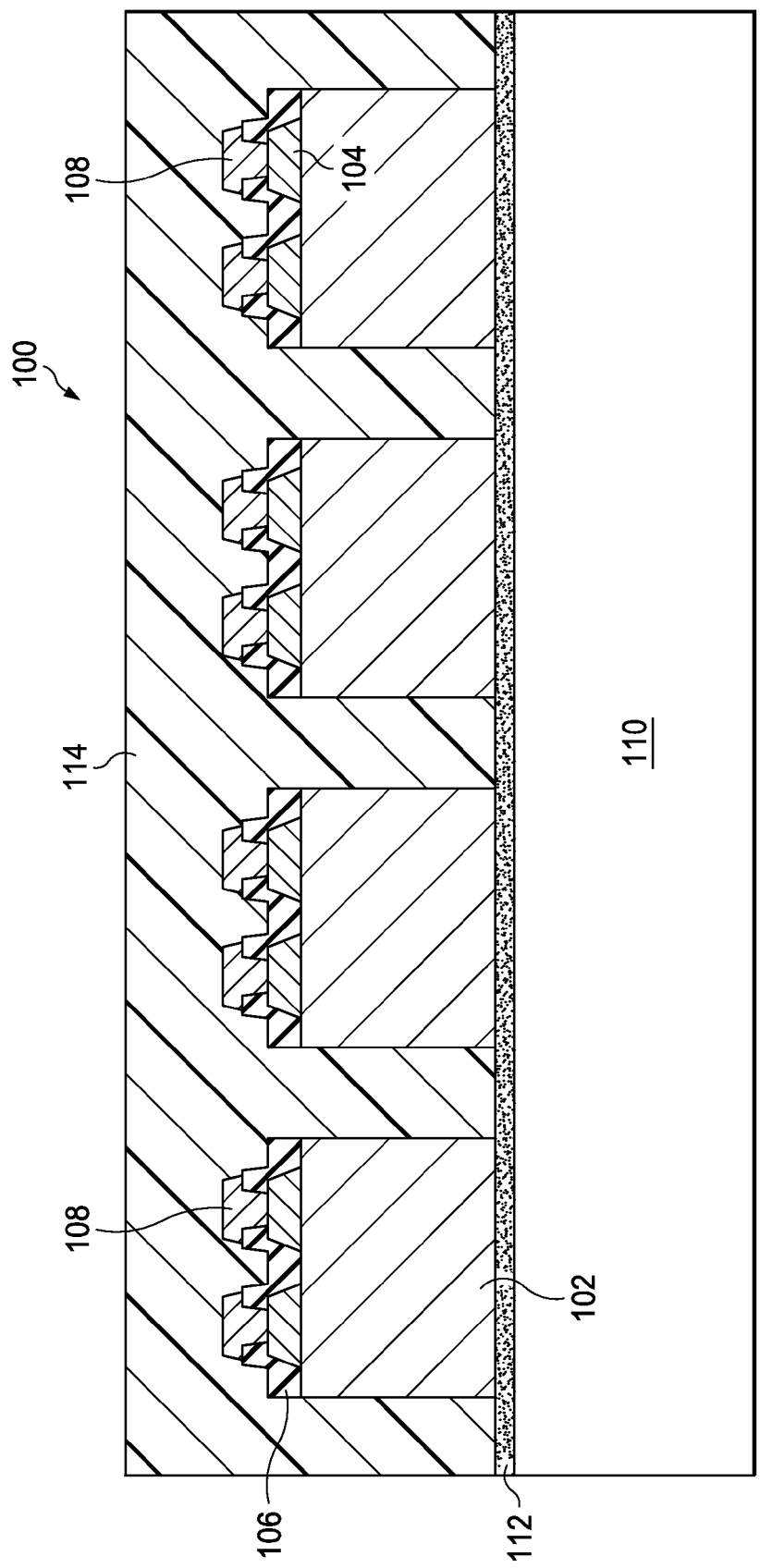

With reference now to FIG. 2E, a molding compound 114 may be used to fill gaps between dies 102 and to cover top surfaces of dies 102. Molding compound 114 may include any suitable material such as an epoxy resin, a molding underfill, or the like. Suitable methods for forming molding compound 114 may include compressive molding, transfer molding, liquid encapsulent molding, or the like. For example, molding compound 114 which may be dispensed between dies 102 in liquid form. A curing process may then be performed to solidify molding compound 114.

Figure 2F:
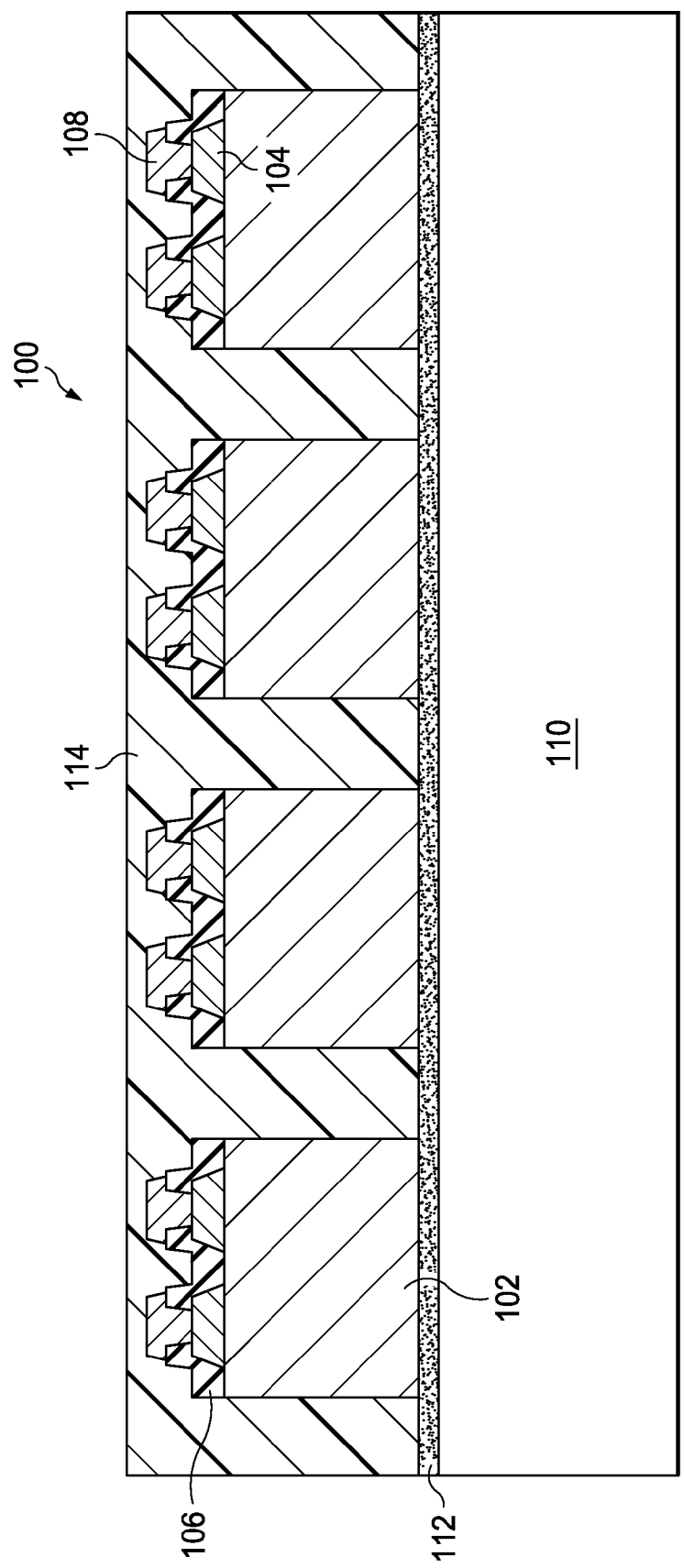

In FIG. 2F, a planarization process, such as a grinding process (e.g., a chemical-mechanical polish (CMP) or mechanical grinding) or etch back, may be performed on molding compound 114 to achieve a desired thickness.

Figure 2G:
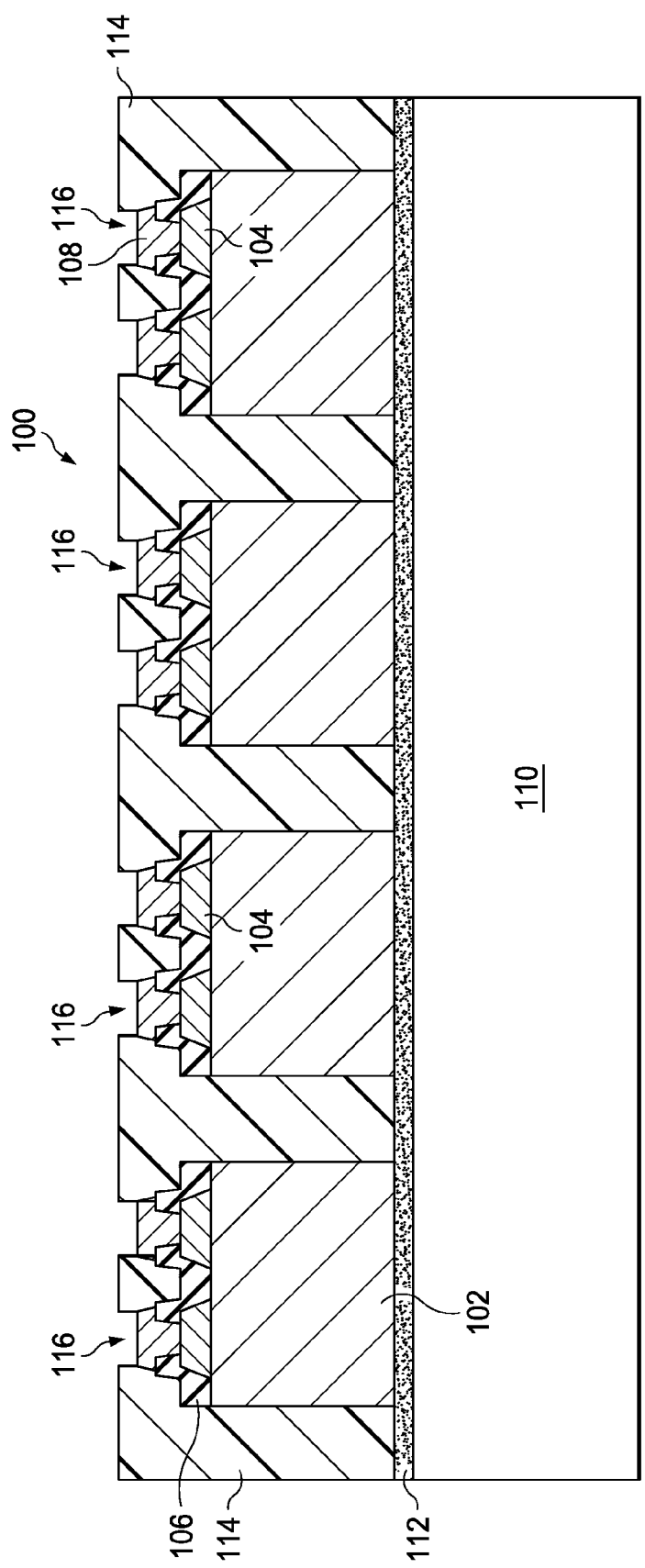

FIG. 2G illustrates the formation of openings 116 in molding compound 114, which expose portions of protective layer 108 of dies 102. Openings 116 may be formed using a laser drilling process, which is a lower cost alternative to traditional photolithography and etching techniques. The inclusion of protective layer 108 prevents damage to contact pads 104 during the laser drilling process. The type of laser used may depend on layout design. For example, an ultra-violet (UV) laser may be used to create openings 116 having a finer pitch, whereas a carbon dioxide ($CO_2$) laser may be used to create openings 116 having a larger pitch. Of course, other types of lasers may be used in alternative embodiments.

Figure 2H:
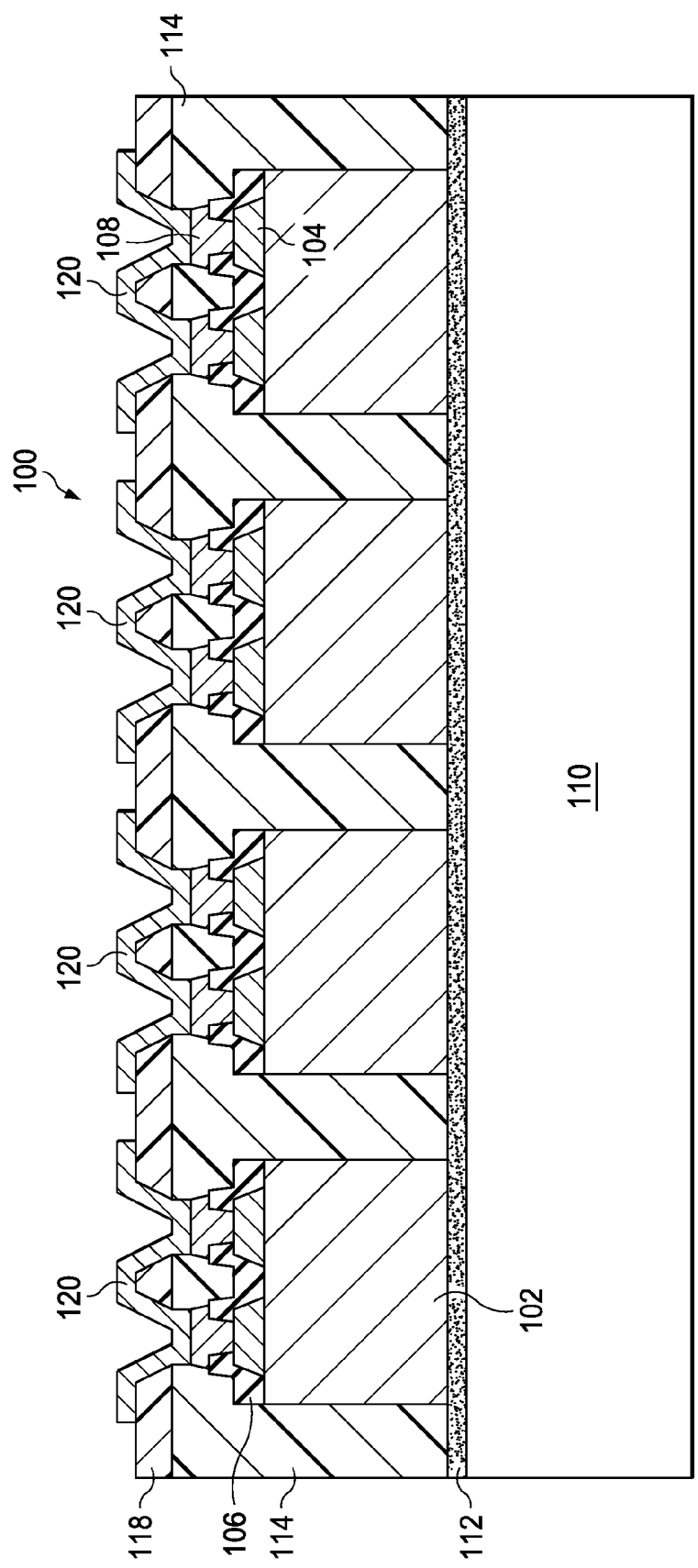

FIG. 2H illustrates the formation of a polymer layer 118 and redistribution layers (RDLs) 120 over dies 102 and molding compound 114. Polymer layer 118 may be formed of any suitable material such as polyimide (PI), polybenzo-xazole (PBO), benzocyclobuten (BCB), epoxy, silicone, acrylates, nano-filled pheno resin, siloxane, a fluorinated polymer, polynorbornene, and the like. Polymer layer 118 may be blanket deposited to fill openings 116 using, for example, spin on coating techniques. Polymer layer 118 may then be patterned using, for example, a combination of photolithographic techniques and etching or laser drilling techniques to expose protective layer 108 in dies 102.

Alternatively, polymer 118 may be formed over molding compound 114 prior to the laser drilling molding compound 114 to form openings 116. In such embodiments, a single laser drilling process may be used to pattern polymer 118 and expose portions of protective layer 108.

RDLs 120 are formed over and extending into polymer layer 118. The formation of RDLs 120 may involve a seed layer and using a mask layer to define the shape of RDLs 120. RDLs 120 may be formed of copper or a copper alloy although other metals such as aluminum, gold, or the like may also be used. RDLs 120 may be electrically connected to contact pads 104 through protective layer 108, and contact pads 104 may electrically connect RDLs 120 to the various devices in dies 102. RDLs 120 may extend past edges of respective dies 102 in a lateral direction, thus forming fan-out packages. Although only one RDL 120 is shown over each die 102, in alternative embodiments, multiple RDLs may be formed over and be interconnected to RDL 120.

Figure 2I:
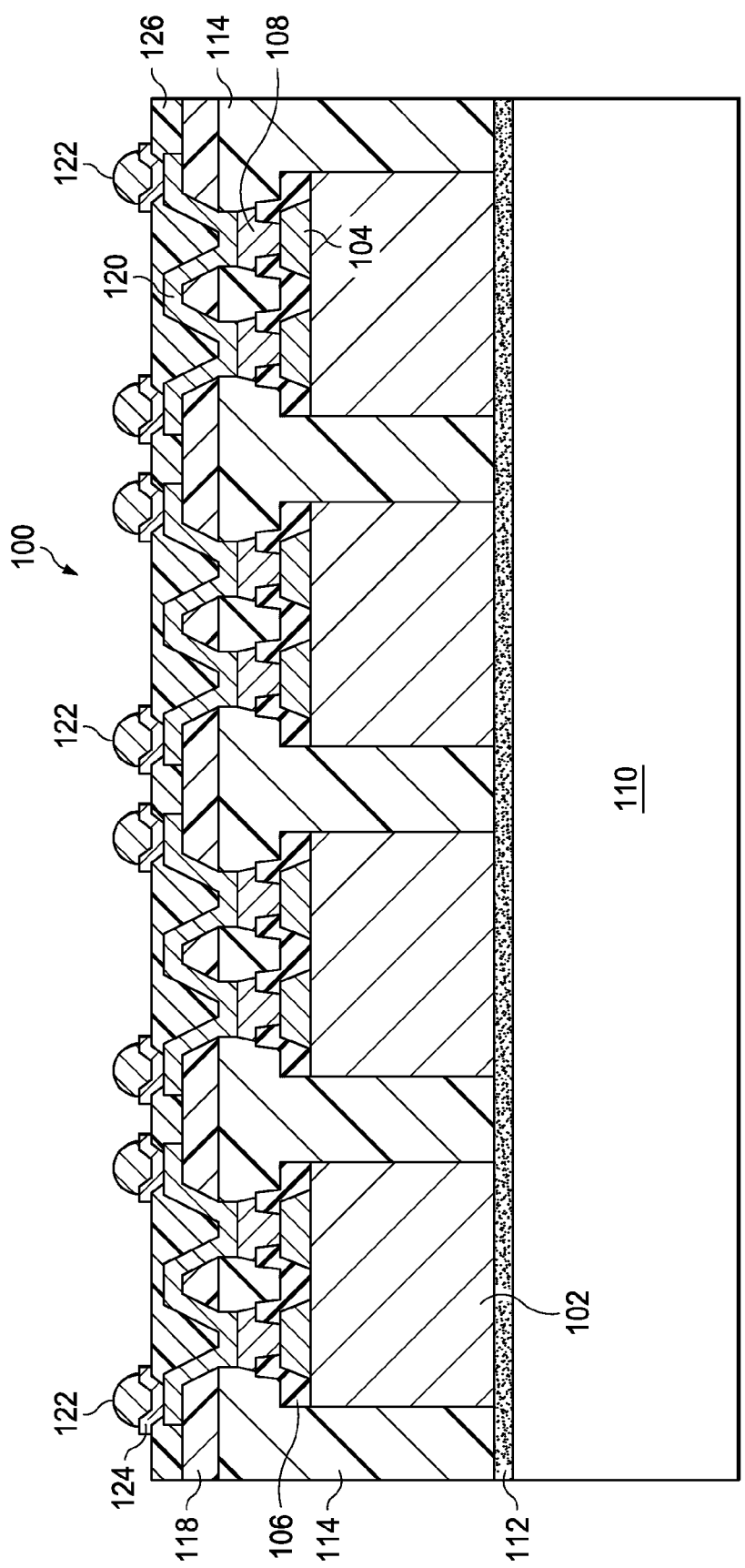

FIG. 2I illustrates the formation of another polymer layer 126 and conductive bumps 122 over RDLs 120. Polymer layer 126 may be substantially similar to polymer layer 118 both in composition and formation processes, and polymer layer 126 may act as a passivation layer or a planarization layer.

Conductive bumps 122 may be formed over UBMs 124 and are electrically connected to portions of RDLs 120. The UBMs may be formed of conductive materials such as copper, copper alloys, titanium, titanium alloys, or the like. Conductive bumps 122 may be reflowable bumps such as solder balls, which may include Sn—Ag, Sn—Cu, Sn—Ag—Cu, or the like. Alternatively conductive bumps 122 may be non-reflowable bumps such as copper bumps, and the like. Conductive bumps 122 are formed to electrically connect and bond other package components such as a wafer, a device die, an interposer, a printed circuit board (PCB), and the like to dies 102.

Figure 2J:
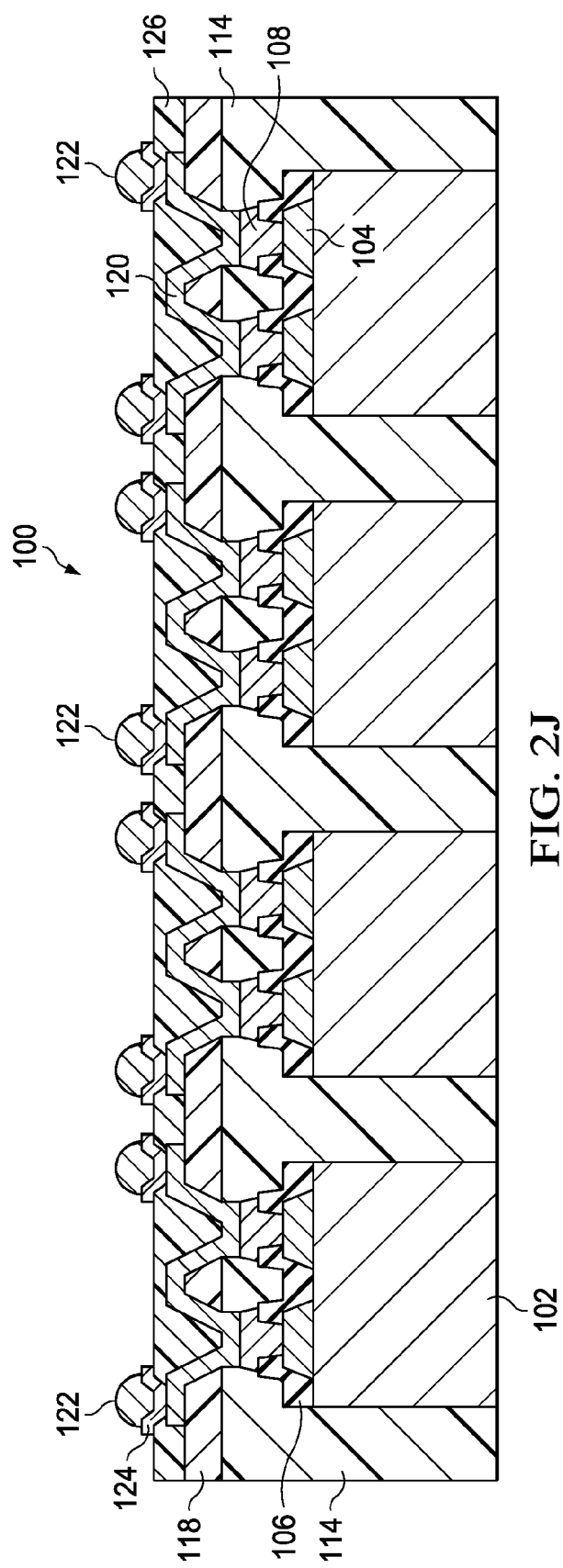

In FIG. 2J, carrier 110 and adhesive layer 112 are removed from dies 102 using any suitable method. For example, in an embodiment in which adhesive layer 112 is formed of UV tape, dies 102 may be removed by exposing adhesive layer 112 to UV light. Subsequently, dies 102 may be singulated for packaging in an IC package. The singulation of dies 102 may include the use of a suitable pick-and-place tool. In a top down view (not shown) of dies 102 molding compound 114 may contact the sidewalls of and encircle each die 102.

Referring back to FIG. 1A, a completed IC structure 130 is illustrated after dies 102 are singulated. A molding compound 114 surrounds die 102. Die 102 includes a contact pad on a top surface, the contact pad is electroless plated with a metallic protective layer 108. A RDL 120 is disposed over and extends into a polymer layer 118, and RDL 120 is electrically connected to devices in die 102 through protective layer 108 and contact pad 104. A second polymer layer 126 is formed over RDL 120 and polymer layer 118. A conductive bump 122 (e.g., a solder bump) is electrically connected to RDL 120 through a UBM 124 in polymer layer 126. Thus, through the various intermediary manufacturing steps described with respect to FIGS. 2A-2J, a fan-out interconnect package such as IC structure 130 may be formed using laser drilling. A protective layer may be used to prevent damage to contact pads of a die during the laser drilling. Laser drilling provides benefits over traditional photolithography and etching processes such as lower cost.

Figure 3:
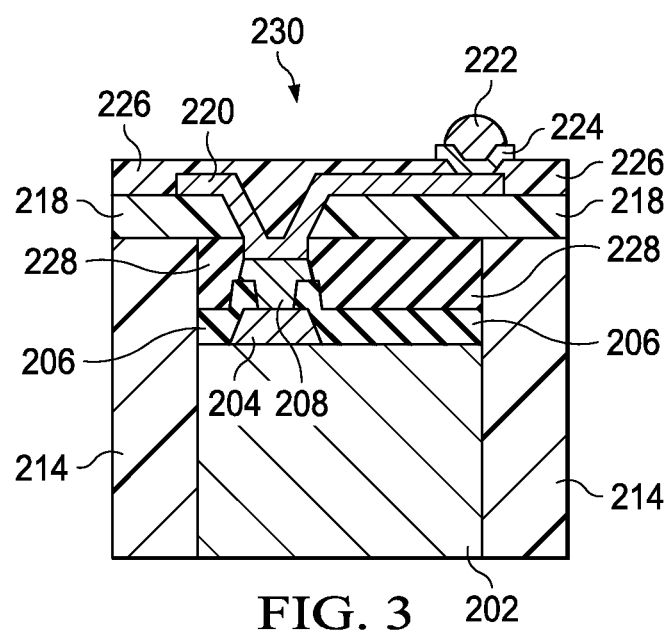
FIG. 3 is a cross sectional view of a fan-out package in accordance with various alternative embodiments.

FIG. 3 illustrates a cross-sectional view of an IC structure 230 in accordance with alternative embodiments. IC structure 230 is similar to IC structure 130 of FIG. 1A, wherein like reference numerals refer to like elements. However, IC structure 230 includes an additional polymer layer 228 disposed over and contacting a die 202. Polymer layer 228 may be a passivation layer, which helps prevents the oxidation of a metallic protective layer 208. Furthermore, the inclusion of polymer layer 228 may allow for improved alignment between RDL 220 and die 202.

Figure 4A:
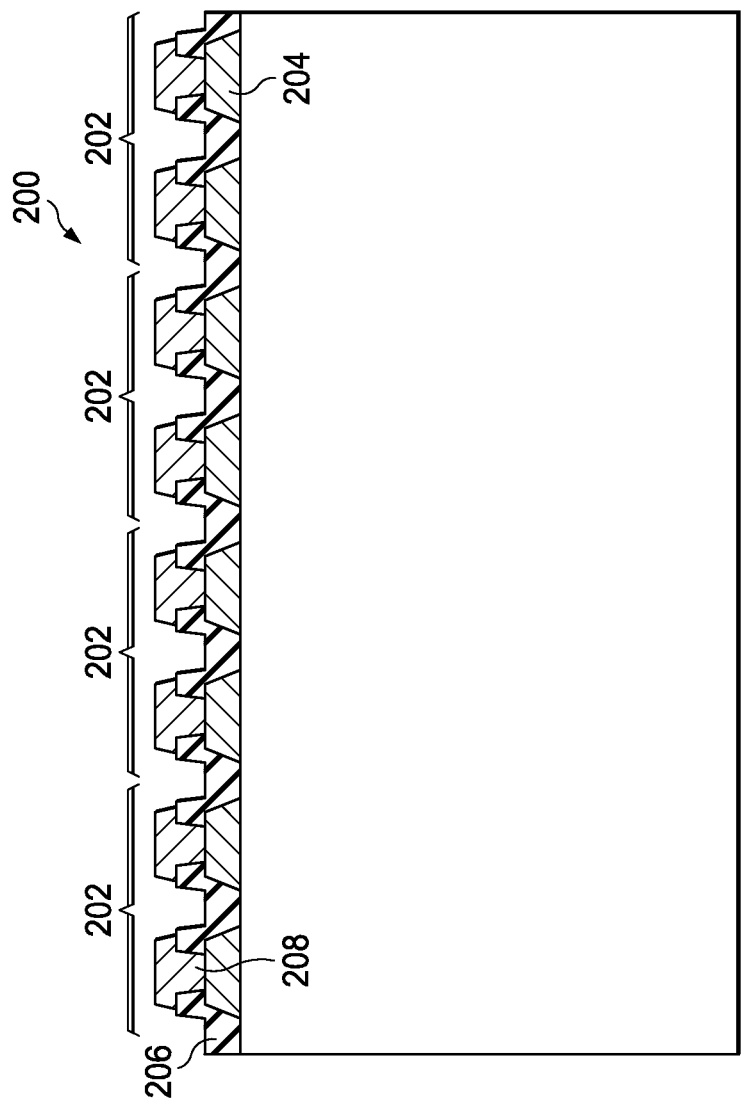
FIGS. 4A through 4F are cross-sectional views of various intermediary stages of manufacture of a fan-out package in accordance with various alternative embodiments.

FIGS. 4A-4F illustrate cross-sectional views of intermediate stages of manufacture of the IC structure 230 of FIG. 3 in accordance with various alternative embodiments. In FIG. 4A, various dies 202 are provided in a wafer 200. Dies 202 include contact pads 204 and a passivation layer 206, which may extend over and cover edge portions of contact pads 204. Metallic protective layer 208 covers contact pads 204 and may be formed of a metallic material having a relatively high melting point, for example, through electroless plating. The various features of dies 202 and protective layer 208 may be substantially similar to dies 102 and protective layer 108, respectively, in FIGS. 1 and 2A-2J. Thus, further description of these features is omitted for brevity.

Figure 4B:
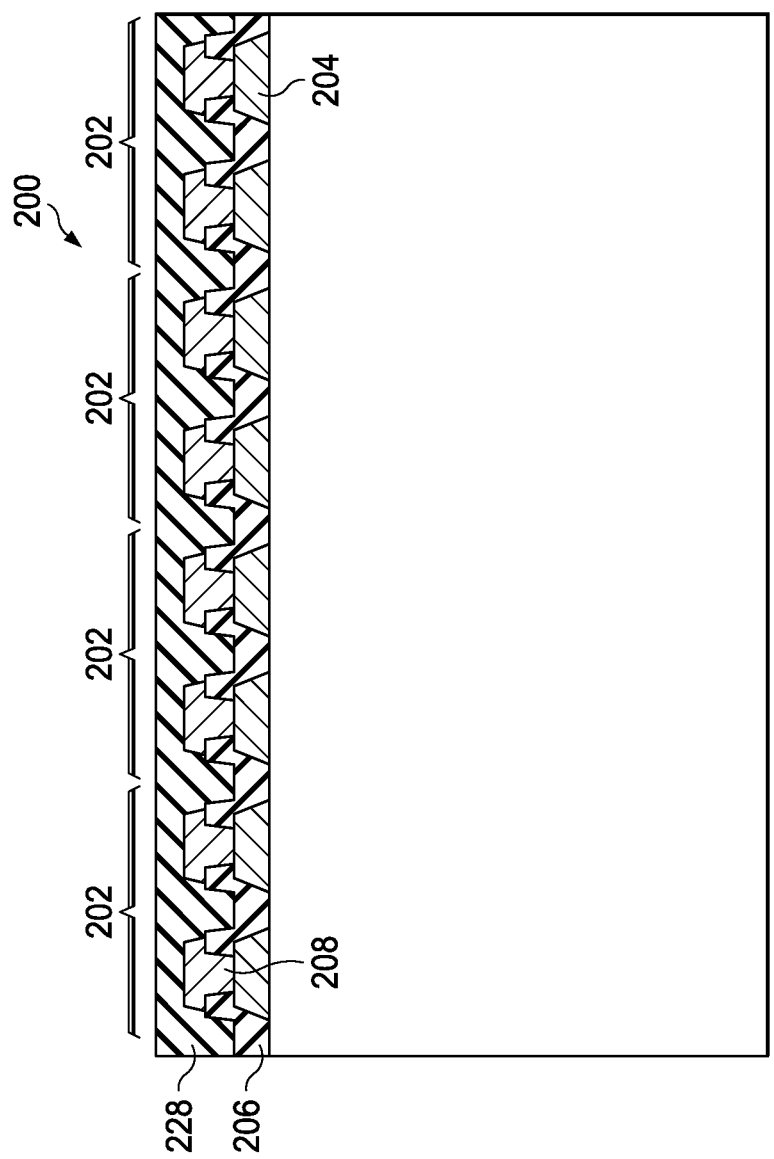

In FIG. 4B, a polymer layer 228 is formed over a top surface of dies 202 and covers protective layer 208. Polymer layer 228 may be substantially similar to polymer layer 118 of IC structure 130. For example, polymer layer 228 may be blanket deposited over dies 202 and be formed of any suitable material such as polyimide (PI), polybenzoxazole (PBO), benzocyclobuten (BCB), epoxy, silicone, acrylates, nano-filled pheno resin, siloxane, a fluorinated polymer, polynorbornene, and the like. Polymer layer 228 may be a passivation layer that prevents oxidation of the metallic material used for protective layer 208.

Figure 4C:
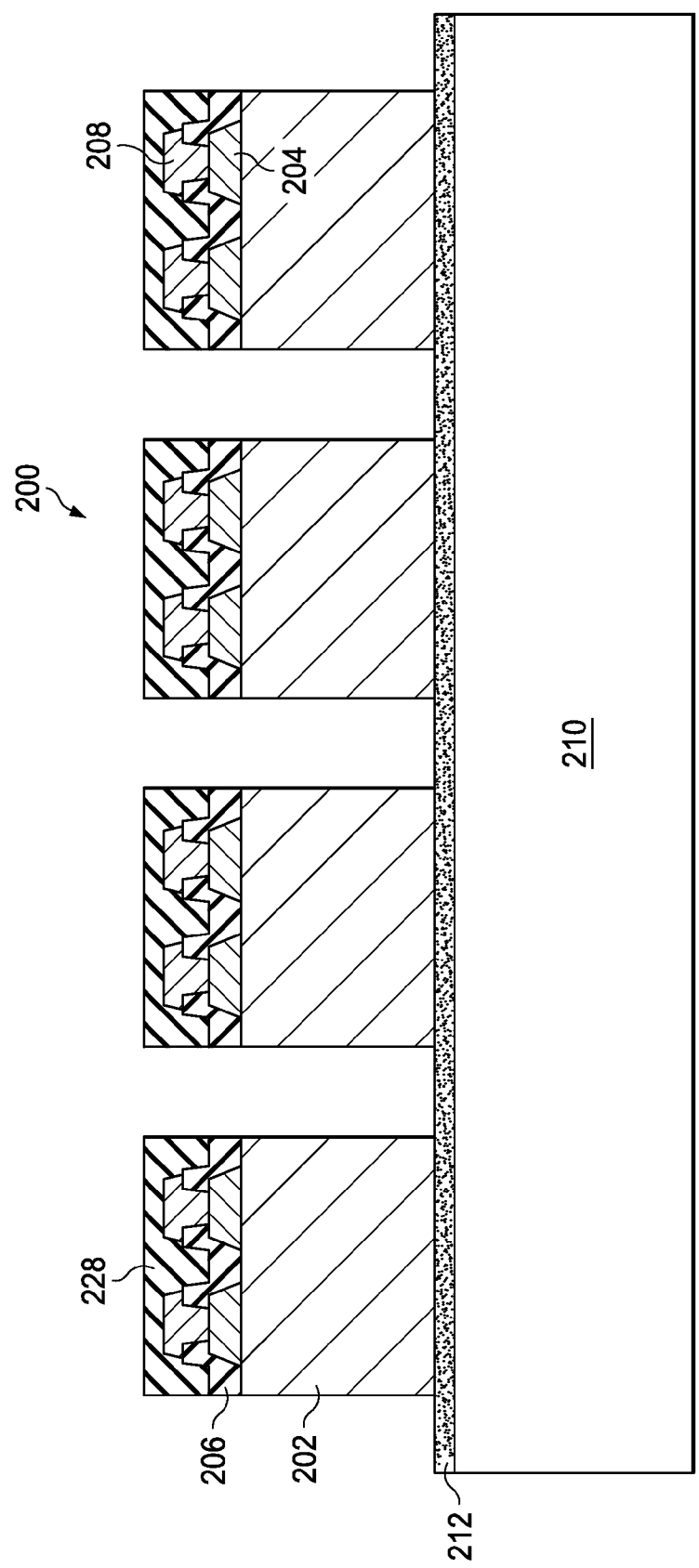

With reference now to FIG. 4C, dies 202 may then be singulated and attached to a carrier 210 through an adhesive layer 212. Carrier 210 and adhesive layer 212 may be substantially similar to carrier 110 and adhesive layer 112, respectively.

Figure 4D:
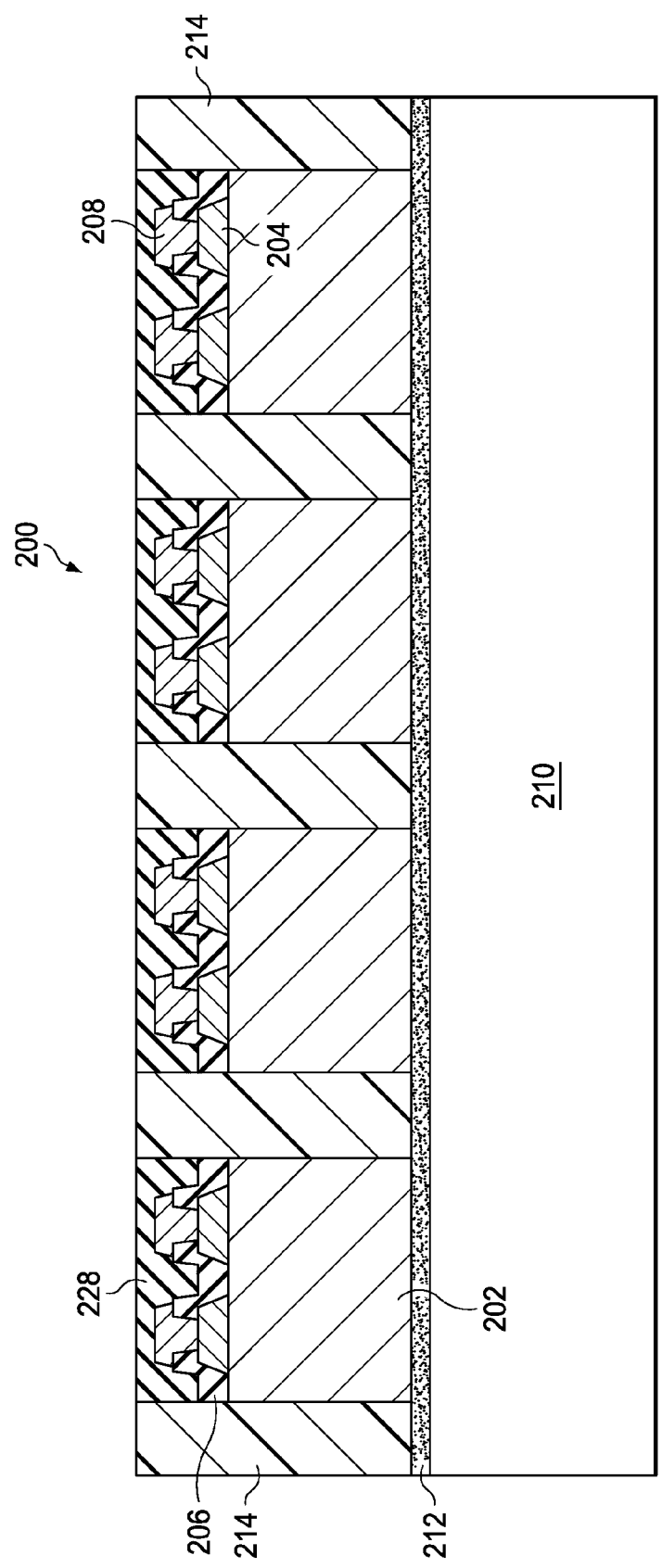

In FIG. 4D, a molding compound 214 may be used fill gaps between dies 202. Molding compound 214 may be any suitable material such as an epoxy resin, a molding underfill, or the like. Suitable methods for forming molding compound 214 may include compressive molding, transfer molding, liquid encapsulant molding, or the like. The filling of molding compound 214 may overflow dies 202 so that molding compound 214 covers a top surface of dies 202. Subsequently, a planarization process (e.g., a CMP or etchback technique) may be employed to remove excess portions of molding compound 214. The planarization process exposes polymer layer 228. As part of the planarization process, top portions of polymer layer 228 may also be removed to achieve a desired thickness. However, dies 202, passivation layer 206 and protective layer 208 may not be exposed.

Figure 4E:
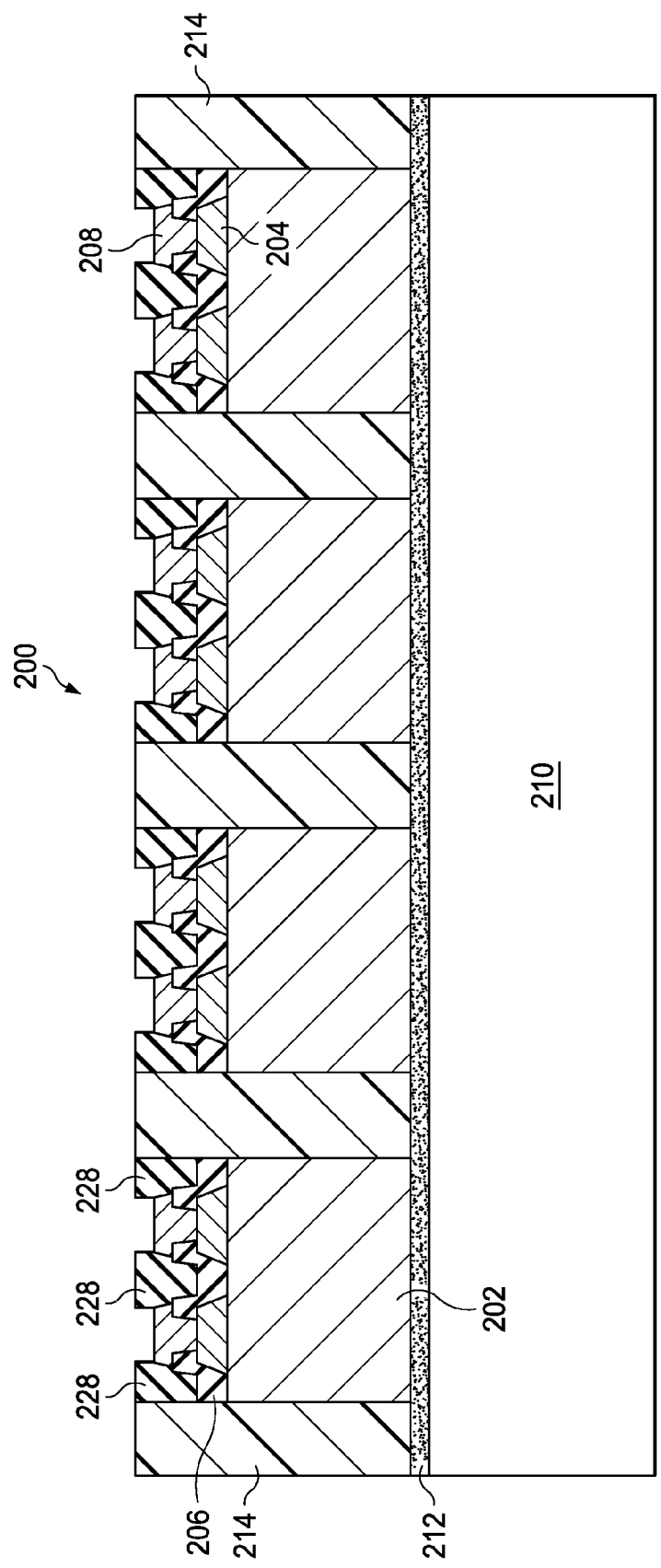

In FIG. 4E, openings are patterned into polymer layer 228 exposing protective layer 208. Polymer layer 228 may be patterned through a laser drilling process. The laser used in the laser drilling process may depend on layout design. For example, for finer pitched openings, an UV laser may be used while a $CO_2$ laser may be used for larger pitched openings. Obviously, other types of lasers may be used as well.

Figure 4F:
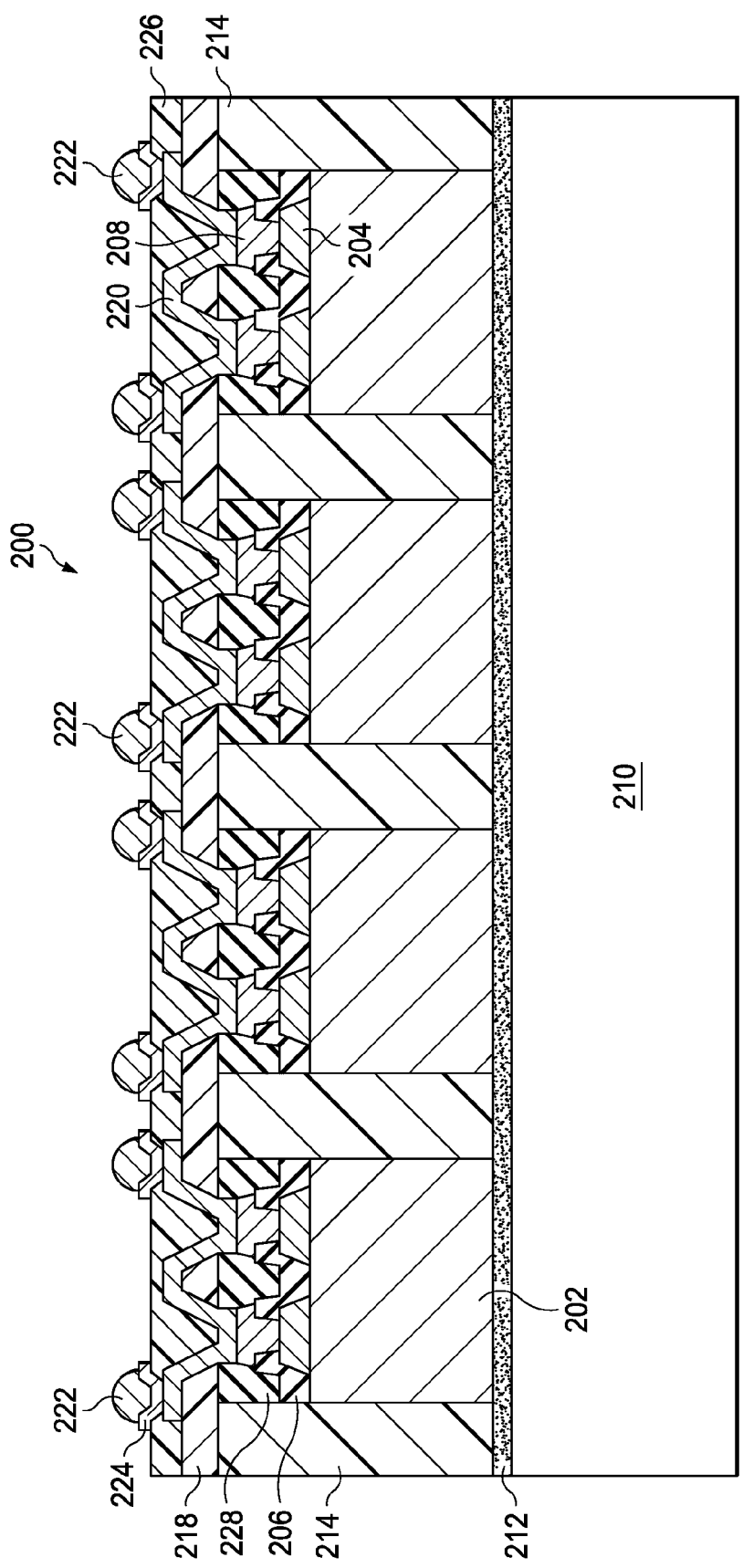

In FIG. 4F, polymer layers 218 and 226, RDLs 220, UBMs 224 (not shown in FIG. 4F, please refer to FIG. 3), and conductive bumps 222 may be formed over molding compound 214 and dies 202. These features may be substantially similar to like features in IC structure 130 of FIG. 1A and detailed description of their formation is omitted for brevity. Alternatively, polymer layer 218 may be formed over polymer layer 228 prior to the patterning of polymer layer 228. In such embodiments, a single laser drilling process may be used to pattern polymer layers 218 and 228 to expose protective layer 208.

Because molding compounds, such as molding compound 114 and 214, may include filler materials, connecting RDLs through a molding compound to underlying dies may suffer from alignment issues caused by the filler material interfering with the focus of alignment tools. Thus, the inclusion of polymer layer 228, which is generally free of such filler materials, between dies 202 and RDL 220 in lieu of a molding compound advantageously improves alignment.

Although only one RDL 220 is shown over each die 202, in alternative embodiments, multiple RDLs may be formed over and be interconnected to RDL 220. Conductive bumps 222, such as bond balls, may be formed over RDL 220. Subsequently, dies 202 may be removed from carrier 210 and singulated.

Referring back to FIG. 3, a completed IC structure 330 is illustrated after dies 202 are singulated. A RDL 220 is disposed over and extends past edges of die 202. RDL 220 is electrically connected to die 202 through contact pad 204, which is electroless plated with a metallic protective layer 208. A polymer layer 228 is disposed over die 202 and protective layer 208. Protective layer 208 may be a metallic paste layer having a relatively high melting point and formed through electroless plating. Polymer layer 228 may be a passivation that prevents oxidation of protective layer 208. Polymer layer 228 may also improve the alignment between RDL 220 and die 202. A conductive bump 222 (e.g., a solder bump) is electrically connected to RDL 220 through a UBM 224 in polymer layer 226. Thus, through the various intermediary manufacturing steps described with respect to FIGS. 4A-4F, a fan-out interconnect package such as IC structure 230 may be formed using laser drilling, which may be a lower cost alternative to photolithography and etching. Protective layer 208 prevents damage to contact pads 204 during the laser drilling process.

In accordance with an embodiment, a method for integrated circuit packaging includes providing a die having a contact pad on a top surface and forming a conductive protective layer over the die and covering the contact pad. A molding compound is formed over the die and the conductive protective layer. The conductive protective layer is exposed using a laser drilling process. A redistribution layer (RDL) is formed over the die. The RDL is electrically connected to the contact pad through the conductive protective layer.

In accordance with another embodiment, a method for integrated circuit packaging includes providing a die having one or more contact pads on a top surface and forming a conductive protective layer by electroless plating each of the one or more contact pads with a metallic material. A molding compound is formed over the die and the conductive protective layer. The conductive protective layer is exposed by laser drilling, and a redistribution layer (RDL) is formed over the die. The RDL extends through a first polymer layer over the conductive protective layer, and the RDL is electrically connected to the contact pad through the conductive protective layer.

In accordance with yet another embodiment, an integrated circuit (IC) structure includes a die. The die includes a contact pad on a top surface, wherein the contact pad is electroless plated with a metallic protective layer. The IC structure further includes a molding compound surrounding sidewalls of the die and a redistribution layer (RDL) over the die and the molding compound. The RDL is electrically connected to the contact pad.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for integrated circuit packaging comprising:
providing a die having a contact pad on a top surface;
forming a passivation layer over and in physical contact with the contact pad;
forming a conductive protective layer over and covering the contact pad, the conductive protective layer comprising a first conductive material and a second conductive material over the first conductive material, the first conductive material being different from the second conductive material, the first conductive material extending through the passivation layer and physically contacting the contact pad, the second conductive material extending over and physically contacting a top surface of the passivation layer;
attaching the die to a carrier, the contact pad being interposed between the carrier and the conductive protective layer;
forming a molding compound over the die and the conductive protective layer;
planarizing the molding compound to expose an insulating layer disposed on a top surface of the conductive protective layer, wherein the insulating layer comprises a sidewall substantially aligned with or contacting a sidewall of the die, wherein a topmost surface of the insulating layer is level with a topmost surface of the molding compound, and wherein the insulating layer physically contacts a sidewall of the second conductive material of the conductive protective layer;
after planarizing the molding compound, while the die is attached to the carrier, exposing the conductive protective layer by laser drilling the insulating layer; and
forming a redistribution layer (RDL) over the die, wherein the RDL is electrically connected to the contact pad through the conductive protective layer.

2. The method of claim 1, wherein the forming the conductive protective layer comprises an electroless plating process.

3. The method of claim 2, wherein the electroless plating process comprises pretreating the die by applying one or more chemical washes to the contact pad and submerging the die in an electroless bath solution at a temperature of about 60 degrees Celsius (C) to about 80 degrees C.

4. The method of claim 1, wherein the conductive protective layer comprises nickel (Ni), copper (Cu), silver (Ag), gold (Au), palladium (Pd), platinum (Pt), tin (Sn), zinc (Zn), ruthenium (Ru), a noble metal, or a combination thereof.

5. The method of claim 1, wherein laser drilling the insulating layer comprises laser drilling an opening exposing the conductive protective layer using an ultraviolet laser or a carbon dioxide laser.

6. The method of claim 1, wherein the insulating layer comprises a first polymer layer.

7. The method of claim 6, wherein planarizing the molding compound comprises grinding the molding compound to expose the first polymer layer.

8. The method of claim 6, wherein the first polymer layer comprises polyimide (PI), polybenzoxazole (PBO), benzocyclobuten (BCB), epoxy, silicone, acrylates, nano-filled pheno resin, siloxane, a fluorinated polymer, polynorbornene, or a combination thereof.

9. The method of claim 6, further comprising:
forming a second polymer layer over the RDL;
forming an under bump metallurgy (UBM) in the second polymer layer, wherein the UBM is electrically connected to the RDL; and
forming a conductive bump on the UBM.

10. The method of claim 1, wherein the insulating layer and the molding compound are formed of a same material.

11. The method of claim 1, wherein forming the molding compound comprises forming the molding compound to extend along sidewalls of the passivation layer.

12. A method for integrated circuit packaging comprising:
providing a die having one or more contact pads on a top surface;
forming a conductive protective layer over the die by electroless plating each of the one or more contact pads with a metallic material;
after forming the conductive protective layer over the die, attaching a bottom surface of the die to a carrier;
after attaching the bottom surface of the die to the carrier, forming a molding compound over the die and the conductive protective layer, wherein the molding compound further extends along sidewalls of the die;
reducing a thickness of the molding compound;
after reducing the thickness of the molding compound and while the bottom surface of the die is attached to the carrier, exposing the conductive protective layer by laser drilling; and
forming a redistribution layer (RDL) over the die, wherein the RDL extends through a first polymer layer over the die, and wherein the RDL is electrically connected to the one or more contact pads through the conductive protective layer.

13. The method of claim 12, wherein the exposing the conductive protective layer comprises laser drilling one or more openings in the molding compound.

14. The method of claim 12, wherein the exposing the conductive protective layer comprises laser drilling one or more openings in a second polymer layer, wherein the second polymer layer is disposed over and contacting the conductive protective layer.

15. The method of claim 12, where the metallic material comprises nickel (Ni), copper (Cu), silver (Ag), gold (Au), palladium (Pd), platinum (Pt), tin (Sn), zinc (Zn), ruthenium (Ru), a noble metal, or a combination thereof.

16. An integrated circuit (IC) structure comprising:
a die comprising a contact pad on a top surface, wherein the contact pad physically contacts the top surface of the die;
a passivation layer over and covering edges of the contact pad, wherein the passivation layer physically contacts the top surface of the die;
a metallic protective layer over the contact pad, the metallic protective layer comprising a first portion and a second portion over the first portion, the first portion comprising a first metallic material, the second portion comprising a second metallic material different from the first metallic material, wherein the first metallic material physically contacts the contact pad, and wherein the second metallic material extends over and physically contacts a top surface of the passivation layer;
a polymer layer over the metallic protective layer and the passivation layer, the polymer layer physically contacting the passivation layer, wherein a width of the second portion of the metallic protective layer narrows as the second portion of the metallic protective layer extends away from the top surface of the passivation layer and into the polymer layer;
a molding compound extending along sidewalls of the die and the passivation layer, a topmost surface of the molding compound being level with a topmost surface of the polymer layer; and
a redistribution layer (RDL) over the die and the molding compound, wherein a portion of the RDL extends through the polymer layer, physically contacts the metallic protective layer and is electrically connected to the contact pad through the metallic protective layer.

17. The IC structure of claim 16, wherein the metallic protective layer comprises nickel (Ni), copper (Cu), silver (Ag), gold (Au), palladium (Pd), platinum (Pt), tin (Sn), zinc (Zn), ruthenium (Ru), a noble metal, or a combination thereof.

18. The IC structure of claim 16, wherein the metallic protective layer has a thickness between 2 μm to 5 μm.

19. The IC structure of claim 16, wherein the molding compound extends along sidewalls of the polymer layer.

20. The IC structure of claim 16, wherein the polymer layer comprises polyimide (PI), polybenzoxazole (PBO), benzocyclobuten (BCB), epoxy, silicone, acrylates, nano-filled pheno resin, siloxane, a fluorinated polymer, polynorbornene, or a combination thereof.

21. The IC structure of claim 16, wherein a sidewall of the second portion of the metallic protective layer has an angle defined by a first line tangent to the sidewall of the second portion of the metallic protective layer and a second line parallel to a top surface of the passivation layer, and wherein the angle is between 45° and 90°.

22. The IC structure of claim 16, wherein the second portion of the metallic protective layer has a horizontal dimension and a vertical dimension, wherein the horizontal dimension is substantially equal to the vertical dimension.

23. The IC structure of claim 16, wherein the polymer layer contacts a sidewall of the metallic protective layer.

24. The IC structure of claim 16, wherein the first metallic material is nickel (Ni), and wherein the second metallic material is copper (Cu).

* * * * *